US009734060B2

(12) United States Patent
Dong et al.

(10) Patent No.: US 9,734,060 B2
(45) Date of Patent: Aug. 15, 2017

(54) ELECTRONIC DEVICE AND METHOD FOR FABRICATING THE SAME

(71) Applicant: SK hynix Inc., Icheon-Si (KR)

(72) Inventors: Cha-Deok Dong, Icheon-si (KR); Ki-Seon Park, Icheon-Si (KR); Bo-Mi Lee, Icheon-Si (KR); Won-Joon Choi, Icheon-Si (KR); Guk-Cheon Kim, Icheon-Si (KR); Yang-Kon Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 92 days.

(21) Appl. No.: 14/789,428

(22) Filed: Jul. 1, 2015

(65) Prior Publication Data

US 2016/0181318 A1     Jun. 23, 2016

(30) Foreign Application Priority Data

Dec. 17, 2014 (KR) .......................... 10-2014-0182684

(51) Int. Cl.
| | | |
|---|---|---|
| *G06F 12/08* | (2016.01) | |
| *G06F 12/0802* | (2016.01) | |
| *H01L 43/08* | (2006.01) | |
| *H01L 43/10* | (2006.01) | |
| *H01L 27/22* | (2006.01) | |

(52) U.S. Cl.
CPC ........ *G06F 12/0802* (2013.01); *H01L 27/222* (2013.01); *H01L 43/08* (2013.01); *H01L 43/10* (2013.01); *G06F 2212/1028* (2013.01); *G06F 2212/202* (2013.01); *G06F 2212/222* (2013.01)

(58) Field of Classification Search
CPC ... G06F 12/0802; G06F 12/08; H01L 27/222; H01L 43/08; H01L 43/10
USPC .................................................. 711/118, 104
See application file for complete search history.

(56) References Cited

U.S. PATENT DOCUMENTS

| | | | | |
|---|---|---|---|---|
| 8,779,406 B2* | 7/2014 | Ito | ......................... | H01L 45/145 257/2 |
| 8,860,157 B2* | 10/2014 | Zheng | ..................... | H01F 10/30 257/421 |
| 9,136,005 B2* | 9/2015 | Choe | ...................... | G11C 16/14 |

(Continued)

FOREIGN PATENT DOCUMENTS

KR     10-2011-0133595     12/2011

*Primary Examiner* — Pierre-Michel Bataille
(74) *Attorney, Agent, or Firm* — Perkins Coie LLP

(57) ABSTRACT

An electronic device is provided to include a semiconductor memory that includes: a substrate including a first region and a second region different from the first region; an interlayer dielectric layer formed over the substrate; a first conductive pattern located over the first region and formed in the interlayer dielectric layer, the first conductive pattern including a planarized top surface with a top surface of the interlayer dielectric layer; a second conductive pattern located over the second region and formed in the interlayer dielectric layer, the second conductive pattern including at least a portion recessed below a top surface of the interlayer dielectric layer; a variable resistance pattern formed over the interlayer dielectric layer the variable resistance pattern having a bottom surface coupled to the first conductive pattern and exhibiting different resistance values; and a capping layer pattern formed over the variable resistance pattern.

18 Claims, 8 Drawing Sheets

(56) References Cited

U.S. PATENT DOCUMENTS

| | | | |
|---|---|---|---|
| 2012/0132882 A1* | 5/2012 | Seo | H01L 27/12 257/4 |
| 2013/0069183 A1 | 3/2013 | Assefa et al. | |
| 2013/0248801 A1* | 9/2013 | Yamamoto | H01L 27/249 257/4 |
| 2014/0124881 A1* | 5/2014 | Kwon | H01L 43/08 257/421 |
| 2015/0249096 A1* | 9/2015 | Lupino | H01L 27/11898 257/203 |
| 2016/0104746 A1* | 4/2016 | Lim | H01L 27/2409 438/478 |

* cited by examiner

ELECTRONIC DEVICE AND METHOD FOR FABRICATING THE SAME

CROSS-REFERENCE TO RELATED APPLICATION

This patent document claims priority of Korean Patent Application No. 10-2014-0182684, entitled "ELECTRONIC DEVICE AND METHOD FOR FABRICATING THE SAME" filed on Dec. 17, 2014, and published on Jun. 27, 2016 as Korean Patent Publication No. 10-2016-0073851, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can secure a variable resistance pattern having a targeted shape although there are height differences between some regions.

In one aspect, an electronic device is provided to include a semiconductor memory that includes a substrate including a first region and a second region different from the first region; an interlayer dielectric layer formed over the substrate; a first conductive pattern located over the first region and formed in the interlayer dielectric layer, the first conductive pattern including a planarized top surface with a top surface of the interlayer dielectric layer; a second conductive pattern located over the second region and formed in the interlayer dielectric layer, the second conductive pattern including at least a portion recessed below a top surface of the interlayer dielectric layer; a variable resistance pattern formed over the interlayer dielectric layer the variable resistance pattern having a bottom surface coupled to the first conductive pattern and exhibiting different resistance values; and a capping layer pattern formed over the variable resistance pattern and having a sidewall aligned with the variable resistance pattern while including a non-metallic material which prevents a penetration of a wet chemical.

In another aspect, an electronic device includes semiconductor memory, and the semiconductor memory includes a substrate including a first region and a second region separate from the first region; an interlayer dielectric layer formed over the substrate; first conductive patterns located over the first region and formed in the interlayer dielectric layer to provide first conductive paths through the interlayer dielectric layer, each conductive pattern including a planarized top surface that has the same height with a top surface of the interlayer dielectric layer; one or more second conductive patterns located over the second region and formed in the interlayer dielectric layer to provide one or more conductive paths through the interlayer dielectric layer, each second conductive pattern including at least a portion recessed below a top surface of the interlayer dielectric layer; a variable resistance pattern layer formed over the interlayer dielectric layer and including first variable resistance patterns over the first region to form an array of memory cells, each first variable resistance pattern having a bottom surface coupled to one of the first conductive patterns and exhibiting different resistance values for storing data; and a capping layer pattern formed over the variable resistance pattern layer and having a sidewall aligned with the variable resistance pattern layer while including a non-metallic material which prevents a penetration of a wet chemical.

Implementations of the above electronic device may include one or more the following.

The capping layer pattern includes an amorphous semiconductor material, a silicon nitride, a silicon oxynitride, a metal oxide or a metal nitride. The capping layer pattern includes a double-layered structure in which a metallic layer and a metal oxide layer are stacked or a double-layered structure in which a metallic layer and a metal nitride layer are stacked. The first region includes a memory cell array region. The second region includes a peripheral circuit region or a vernier key region. The variable resistance pattern includes an MTJ (Magnetic Tunnel Junction) structure. Each of the first variable resistance patterns over the first region to form the array of memory cells includes an MTJ (Magnetic Tunnel Junction) structure. The semiconductor memory further includes: an additional conductive pattern penetrating through the capping layer pattern to be coupled to a top surface of the variable resistance pattern. The substrate further includes a third region, the interlayer dielectric layer further has a third conductive pattern located over the third region of the substrate, at least a portion of the third conductive pattern is recessed below the top surface of the interlayer dielectric layer, and the size of the recessed portion of the third conductive pattern is greater than the size of the recessed portion of the second conductive pattern. The first region includes a memory cell array region. The second region includes a peripheral circuit region. The third region includes a vernier key region.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In one aspect, a method for fabricating an electronic device comprising a semiconductor memory includes providing a substrate in which a first region and a second region are defined; forming an interlayer dielectric layer having a first conductive pattern and a second conductive pattern, over the substrate, wherein the first conductive pattern is located at the first region and has a planarized top surface with the interlayer dielectric layer, and the second conductive pattern is located at the second region and includes at least a portion recessed below a top surface of the interlayer dielectric layer; forming a variable resistance layer over the interlayer dielectric layer to cover the first conductive pattern and the second conductive pattern; forming a capping layer including a non-metallic material which prevents a penetration of a wet chemical, over the variable resistance layer; forming a mold layer over the capping layer; forming a hard mask pattern in a portion of the mold layer corresponding to the first region; removing at least a portion of the mold layer; and etching the capping layer and the variable resistance layer using the hard mask pattern.

Implementations of the above method may include one or more the following.

The capping layer includes an amorphous semiconductor material, a silicon nitride, a silicon oxynitride, a metal oxide or a metal nitride. The forming of the capping layer comprising: forming a metallic layer over the variable resistance layer; and oxidizing at least an upper portion of the metallic layer. The forming of the capping layer comprising: forming a metallic layer over the variable resistance layer; and nitrifying at least an upper portion of the metallic layer. The forming of the capping layer is performed at a temperature of 300° C. or less. The first region includes a memory cell array region and the second region includes a peripheral circuit region. The first region includes a memory cell array region and the second region includes a vernier key region. At a time that the mold layer of the first region is removed, a portion of the mold layer of the second region remains and a hard mask material formed of a same material as the hard mask pattern adheres to the portion of the mold layer of the second region. The variable resistance layer includes an MTJ (Magnetic Tunnel Junction) structure. The method further comprising: forming an additional conductive pattern penetrating through the capping layer to be coupled to a top surface of the variable resistance layer, after the etching of the capping layer and the variable resistance layer. The substrate further defines a third region different from the first and second regions, and wherein: the interlayer dielectric layer further includes a third conductive pattern located over the third region of the substrate, at least a portion of the third conductive pattern is recessed below the top surface of the interlayer dielectric layer, and a width and a depth of the recessed portion of the third conductive pattern are larger than a width and a depth of the recessed portion of the second conductive pattern. The first region includes a memory cell array region, the second region includes a peripheral circuit region, and the third region includes a vernier key region.

These and other aspects, implementations and associated advantages are described in greater detail in the drawings, the description and the claims.

DETAILED DESCRIPTION

Figure 1:
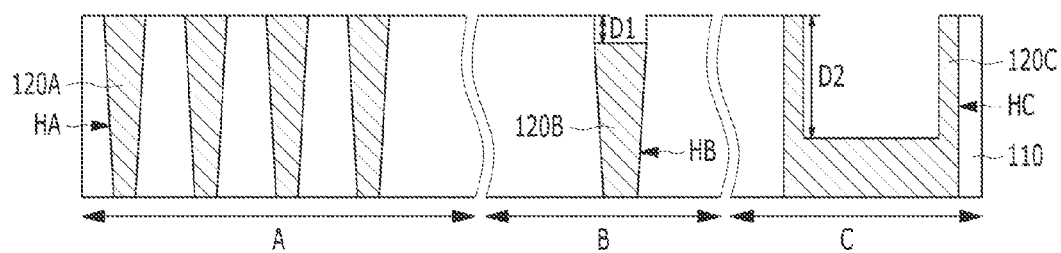
FIGS. 1 to 6 are views explaining a semiconductor device and an example of a method for fabricating the same in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1 to 6 are views explaining a semiconductor device and an example of a method for fabricating the same in accordance with an implementation. FIGS. 1, 2A, 3, 4, 5 and 6 are cross-sectional views, and FIG. 2B is an example of an enlarged view of a portion of FIG. 2A.

First, the fabricating method will be described.

Referring to FIG. 1, a first interlayer dielectric layer 110 formed over a substrate (not shown) can be patterned to include different regions such as a first region A, a second region B and a third region C. Regions A, B and C can be further patterned to include various shapes of conductive patterns 120A, 120B and 120C over the substrate, respectively. Here, the first region A may be or include a region where variable resistance elements are disposed, and the second and third regions B and C may be or include a region where other elements are disposed. In the first region A, each variable resistance element has a structure exhibiting different resistance states under different electrical voltages or currents and is formed over a corresponding conductive pattern 120.

One example of a suitable process for forming the structure of the semiconductor device in FIGS. 1-6 is described below.

First, the substrate may be provided. Here, the substrate may include certain required elements (now shown). For example, an access element for controlling a supply of a voltage or current to the variable resistance element such as a transistor, a diode and the like, may be formed in the substrate of the first region A.

The variable resistance element of the first region A may be switched between different resistance states to serve as a memory cell for storing data. When the variable resistance element serves as the memory cell, and the first region A may be or include a memory cell array region having an array of variable resistance elements. The second region B may be or include a peripheral circuit region in which various peripheral circuits are formed. The third region C may be or include a vernier key region in which an overlay vernier is formed to measure the degree of an overlap between different layers in a semiconductor device having a multi-layered structure.

Then, the first interlayer dielectric layer 110 may be formed over the substrate. The first interlayer dielectric layer 110 may be formed of or include an insulating material, for example, an oxide, a nitride, or a combination thereof.

Then, a first opening HA exposing the substrate of the first region A, a second opening HB exposing the substrate of the second region B, and a third opening HC exposing the substrate of the third region C may be formed in the first interlayer dielectric layer 110 by selectively etching the first interlayer dielectric layer 110. As shown in FIGS. 1-6, multiple first openings HA can be formed in the first region A to expose the underlying substrate for forming multiple conductive patterns 120A.

Here, in a direction parallel to a top surface of the substrate, a width of the first opening HA may be smaller than a width of the second opening HB and a width of the third opening HC. Furthermore, when the second region B is a peripheral circuit region and the third region C is a vernier key region, the width of the third opening HC may be larger or greater than the width of the second opening HB. Accordingly, for example, a pattern with a smallest width is formed in the first region A where the memory cells are disposed and a pattern with the largest or greatest width is formed in the third region C where the overlay vernier is disposed.

next in the fabrication process, a conductive material having a thickness sufficient to fill the first to third openings HA, HB and HC is formed, and then, a planarization process, for example, a CMP (Chemical Mechanical Polishing) process may be performed to the resultant structure by filling the openings HA, HB and HC with the conductive material until a top surface of the first interlayer dielectric layer 110 of the first region A is exposed. In some implementations, necessary etching processes may be additionally performed. Performing the planarization process based on the top surface of the first region A is for securing characteristics of the variable resistance element. This will be described later in more detail.

As a result, a first conductive pattern 120A, a second conductive pattern 120B and a third conductive pattern 120C are formed and are filled in the first opening HA, the second opening HB and the third opening HC, respectively. The first conductive pattern 120A may serve as an electrical contact for coupling a corresponding variable resistance element to the access element of the substrate, and may be structured to have a single-layered structure or a multi-layered structure including a metal, or a metal nitride, etc. The first conductive pattern 120A may have a planarized top surface such that the top surface of each conductive pattern 120A in the first region A is co-planar with, has the same height as, the adjacent top surface of the first interlayer dielectric layer 110. On the other hand, the top surface of the second conductive pattern 120B constituting a part of the peripheral circuit and the third conductive pattern 120C constituting a part of the overlay vernier do not have, or may not be required to have, planarized top surfaces that are co-planar with respect to, and have the same height as, their corresponding adjacent top surfaces of the first interlayer dielectric layer 110. In implementations of the above planarization process and any additional etching process, at least a portion of the second conductive pattern 120B and/or at least a portion of the third conductive pattern 120C may be recessed below the top surface of the first interlayer dielectric layer 110. This is because at least one of the planarization process and any additional etching process that are described above is performed such that the second and third openings HB and HC have a larger or greater width than the first opening HA. For example, the whole top surface of the second conductive pattern 120B may be lower than the top surface of the first interlayer dielectric layer 110 by a first depth D1. Also, for example, a central portion of the top surface of the third conductive pattern 120C may be lower than the top surface of the first interlayer dielectric layer 110 by a second depth D2. However, other implementations may be also possible. For example, depending on specifics of a fabrication process, at least a portion of the second conductive pattern 120B and at least a portion of the third conductive pattern 120C may be lower than the top surface of the first interlayer dielectric layer 110. Since the third opening HC has the greatest width in this implementation, the second depth D2 may be greater than the first depth D1.

Figure 2A:
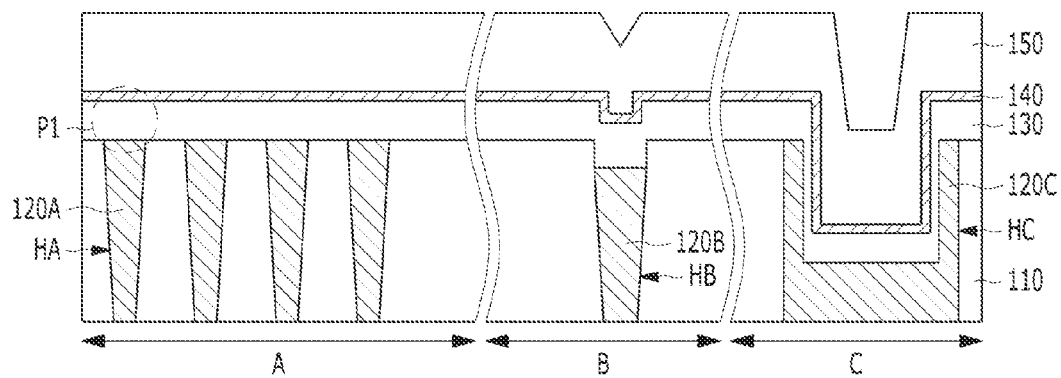
Figure 2B:
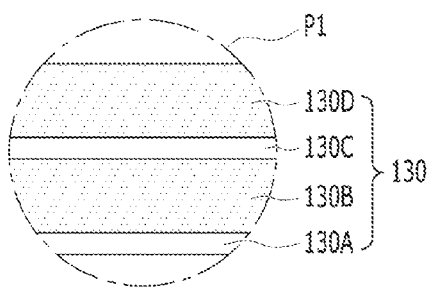

Referring to FIGS. 2A and 2B, a variable resistance layer 130 may be formed over the resultant structure of FIG. 1 having a conductive pattern 120A in the first region A. The variable resistance layer 130 may include one or more layers to form the variable resistance element as shown as "P1" in FIGS. 2A and 2B over a corresponding conductive pattern 120A in the first region A.

For example, the variable resistance layer 130 may have a single-layered structure or a multi-layered structure including various materials used in an RRAM, a PRAM, an FRAM, or an MRAM, and the like, for example, a transition metal oxide, a metal oxide such as a perovskite-based material, or a phase-change material such as a chalcogenide-based material, a ferroelectric material, or a ferromagnetic material, etc.

In this implementation, as shown by the layers within P1 in FIG. 2B, the variable resistance layer 130 may include an MTJ (Magnetic Tunnel Junction) structure including a first magnetic layer 130B, a tunnel insulating layer 130C and a second magnetic layer 130D. In this case, one of the first and second magnetic layers 130B and 130D may serve as a pinned layer having a pinned magnetization direction, and the other of the first and second magnetic layers 130B and 130D may serve as a free layer having a variable magnetization direction. Each of the first and second magnetic layers 130B and 130D may have a single-layered structure or a multi-layered structure including a ferromagnetic material such as an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. Under a sufficiently strong electrical bias such as a current in a data writing process, the tunnel insulating layer 130C may change the magnetization direction of the free layer by tunneling of spin-polarized electrons based on spin torque transfer. The tunnel insulating layer 130C may have a single-layered structure or a multi-layered structure including an oxide such as $Al_2O_3$, MgO, CaO, SrO, TiO, VO, or NbO, etc. Furthermore, in addition to the MTJ structure, the variable resistance layer 130 may include one or more additional layers disposed over or under the MTJ structure to facilitate fabricating processes and improve characteristics of the MTJ structure. For example, the variable resistance layer 130 may include a seed layer 130A disposed under the MTJ structure and helping an overlying layer, for example, the free layer to grow to have a targeted or desired crystalline structure for an improved or enhanced MTJ performance. The seed layer 130A may be formed of or include various alloy materials.

The variable resistance layer 130 may be formed along a profile of the resultant structure of FIG. 1 beyond the region A by, for example, a PVD (Physical Vapor Deposition) process such as a sputtering. Due to this fabrication process, the variable resistance layer 130 formed outside the region A may be bent because of presence of non-planarized top surfaces outside the region A, such as portions of the variable resistance layer 130 over the recessed portions of the second and third regions B and C. As a result, a seam or a crack may be formed in the variable resistance layer 130 of the second and third regions B and C.

Next in the fabrication process, a capping layer 140 may be formed over the variable resistance layer 130. The capping layer 140 may be formed along a profile of the variable resistance layer 130 above the region A and other regions such as regions B and C. The capping layer 140 may include a non-metallic material which prevents a wet chemical from penetrating into the variable resistance layer 130 in a subsequent process of removing a mold layer. In an example, the capping layer 140 may include an amorphous semiconductor material such as an amorphous Si, an amorphous SiGe, or an amorphous SiGe doped with B, etc. In another example, the capping layer 140 may include a silicon nitride or a silicon oxynitride. In another example, the capping layer 140 may include a metal oxide or a metal nitride.

The capping layer 140 may be formed by performing a process having an excellent step coverage characteristic that would fully cover surfaces of corners and uneven or non-flat surface structures. Some of suitable processes that can be used for forming this capping layer 140 are, for example, an ALD (Atomic Layer Deposition) process, a PE-CVD (Plasma Enhanced Cemical Vapor Deposition) process, an LP-CVD (Low Pressure Chemical Vapor Deposition) process and the like. The process for forming the capping layer 140 may be carried out, for example, at a temperature of 300° C. or less, in order to prevent a deterioration of the characteristics of the variable resistance layer 130 located under the capping layer 140. When the capping layer 140 includes a metal oxide, the capping layer 140 may be formed by depositing a metallic layer and oxidizing a whole or an upper portion of the metallic layer. When the capping layer 140 includes a metal nitride, the capping layer 140 may be formed by depositing a metallic layer and nitrifying a whole or an upper portion of the metallic layer. A thickness of the upper portion of the metallic layer which is oxidized or nitrified may correspond to ⅓ to ⅔ of a thickness of the metallic layer. The whole or the upper portion of the metallic layer which is oxidized or nitrified may be changed into a non-metallic ceramic material to prevent a penetration of a wet chemical. When the upper portion of the metallic layer is oxidized or nitrified, the capping layer 140 may have a double-layered structure in which a metallic layer and a metal oxide layer are stacked, or, a double-layered structure in which a metallic layer and a metal nitride layer are stacked. The capping layer 140 may have a thickness in a range from 50 Å to 150 Å in order to prevent the penetration of the wet chemical.

After formation of the capping layer 140, a mold layer 150 may be formed over the capping layer 140. The mold layer 150 may serve to provide a space where a hard mask pattern (see a reference numeral 160A of FIG. 3) for etching the variable resistance layer 130 is to be formed. The mold layer 150 may include a silicon oxide and be formed along a profile of the capping layer 140. Therefore, the mold layer 150 may have a recessed portion in each of the second and third regions B and C. Here, a width and a depth of the recessed portion of the mold layer 150 of the second region B may be smaller than a width and a depth of the recessed portion of the mold layer 150 of the third region C.

Figure 3:
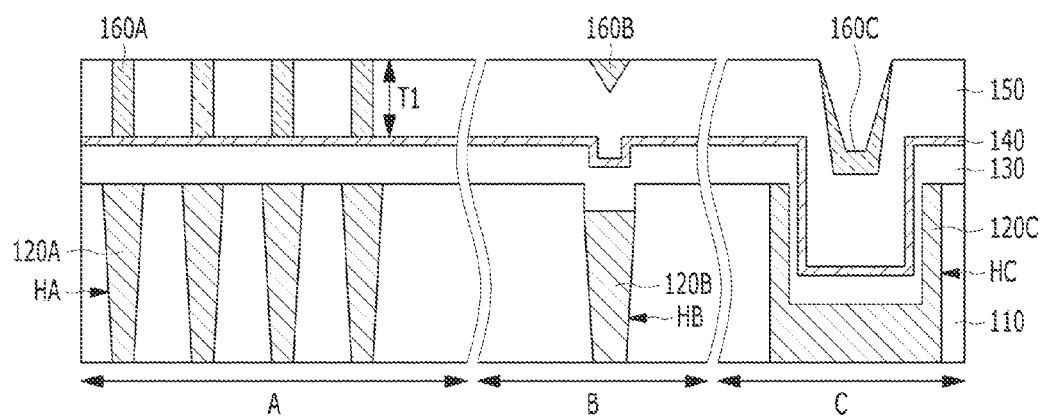

Referring to FIG. 3, a hard mask pattern 160A for patterning the variable resistance layer 130 may be formed in the mold layer 150 of the first region A. The hard mask pattern 160A may be formed by selectively etching the mold layer 150 of the first region A to provide a space where the hard mask pattern 160A is to be formed, depositing a hard mask material to a thickness sufficient to fill the space, and performing a planarization process until a top surface of the mold layer 150 is exposed. The hard mask pattern 160A may be formed of or include a material which has an etch rate different from those of the capping layer 140 and the mold layer 150.

In this process, the hard mask material may remain in the recessed portions of the mold layer 150 of the second and third regions B and C. Hereinafter, the hard mask material remaining in the recessed portion of the mold layer 150 of the second region B may be referred to as a first hard mask material 160B, and the hard mask material remaining in the recessed portion of the mold layer 150 of the third region C may be referred to as a second hard mask material 160C.

Figure 4:
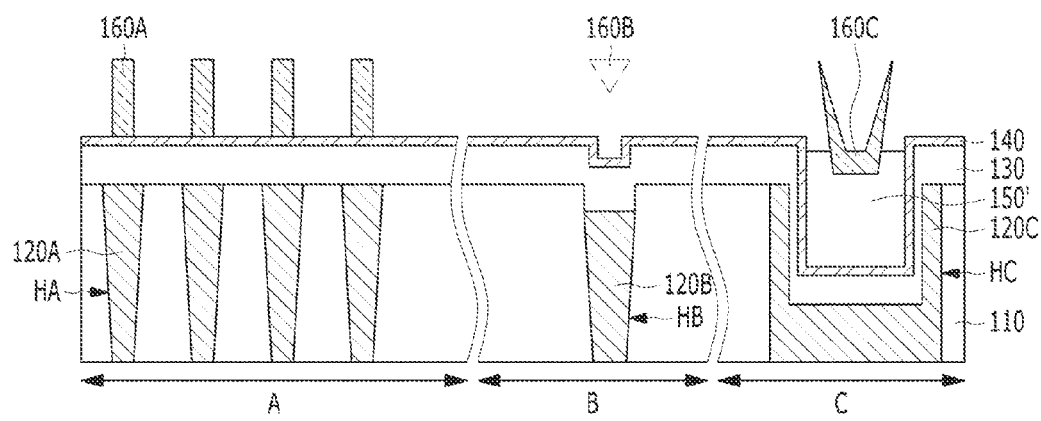

Referring to FIG. 4, a whole of the mold layer 150 of the first region A may be removed by a wet etching process, for example, a wet dip-out process.

When the whole of the mold layer 150 of the first region A is removed, a whole of the mold layer 150 of the second region B may be removed. This is because the depth of the recessed portion of the second region B is relatively small. Therefore, the first hard mask material 160B of the second region B may be removed together with the mold layer 150 of the second region B. On the other hand, since the depth of the recessed portion of the third region C is relatively large, a portion of the mold layer 150 may remain in the third region C. Hereinafter, the mold layer 150 remaining in the third region C may be referred to as a remaining mold layer 150'. Due to this, the second hard mask material 160C of the third region C may adhere to the remaining mold layer 150'.

Figure 5:
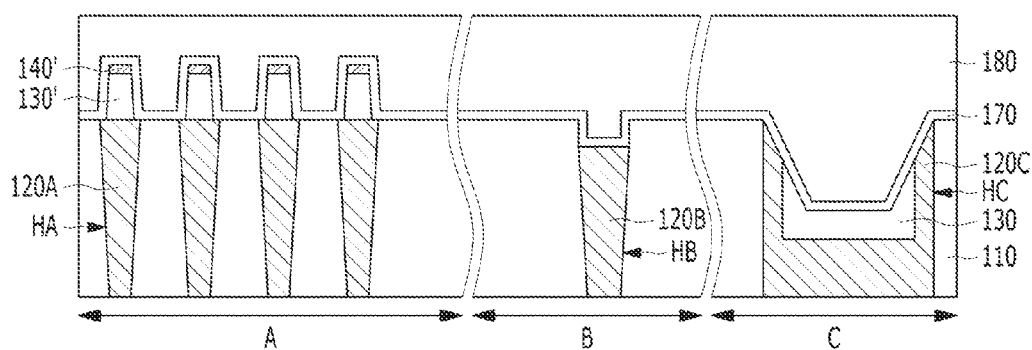

Referring to FIG. 5, a capping layer pattern 140' may be formed by etching the capping layer 140 using the hard mask pattern 160A as an etching barrier, and then, a variable resistance pattern 130' may be formed by etching the variable resistance layer 130 using at least the capping layer pattern 140' as an etching barrier. In FIG. 5, multiple variable resistance patterns 130' are formed and separated from one another over the first region A and can form an array of memory cells. The hard mask pattern 160A may be naturally removed in these etching processes, or, may be removed by an additional removing process. During the removal of the hard mask pattern 160A, the second hard mask material 160C may be removed together with the hard mask pattern 160A. Also, during the formation of the capping layer pattern 140', a part or a whole of the capping layer 140 of the second and third regions B and C may be removed. Also, during the formation of the variable resistance pattern 130', a part or a whole of the variable resistance layer 130 of the second and third regions B and C may be removed.

Then, a spacer layer 170 for protecting the variable resistance pattern 130' may be formed along a resultant structure. The spacer layer 170 may be formed of or include an insulating material such as a silicon nitride, etc. The forming of the spacer layer 170 may be skipped as necessary.

Then, a second interlayer dielectric layer 180 may be formed over the spacer layer 170. The second interlayer dielectric layer 180 may be formed of or include various insulating materials such as a silicon oxide, and have a planarized top surface.

Figure 6:
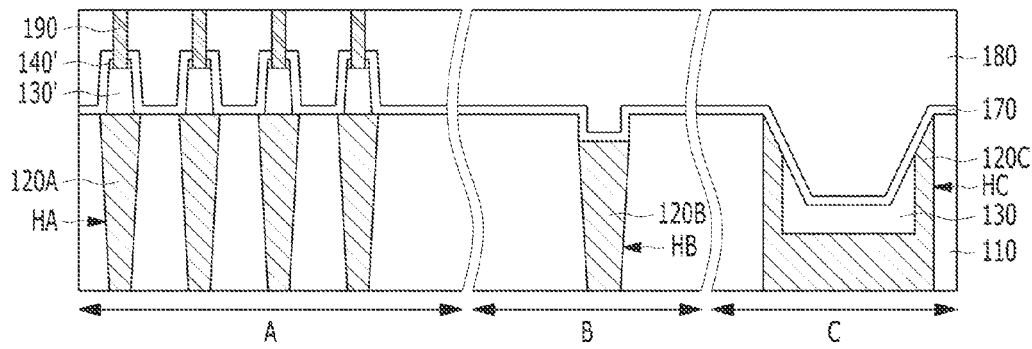

Referring to FIG. 6, a hole exposing a top surface of the variable resistance pattern 130' may be formed by selectively etching the second interlayer dielectric layer 180, the spacer layer 170 and the capping layer pattern 140' of the first region A, and then, a conductive material may fill the hole to form a fourth conductive pattern 190. The fourth conductive pattern 190 may serve to couple the variable resistance pattern 130' to another conductive pattern (not shown) located over the second interlayer dielectric layer 180 such as a conductive line, and have a single-layered structure or a multi-layered structure including a metal, or a metal nitride, etc.

By the aforementioned processes, the semiconductor device of FIG. 6 may be fabricated.

Referring again to FIG. 6, the semiconductor device in accordance with the implementation may include the substrate in which the first to third regions A, B and C are defined, the first interlayer dielectric layer 110 formed over the substrate and having the first to third conductive patterns 120A, 120B and 120C which are formed in the first to third regions A, B and C, respectively, the variable resistance pattern 130' formed over the first interlayer dielectric layer 110 of the first region A and having a bottom surface coupled to the first conductive pattern 120A, the capping layer pattern 140' covering the top surface of the variable resistance pattern 130' and having a sidewall aligned with the variable resistance pattern 130', and the fourth conductive pattern 190 penetrating through the capping layer pattern 140' to be coupled to the top surface of the variable resistance pattern 130'.

In FIG. 6, the first interlayer dielectric layer 110 and the first conductive pattern 120A may have planarized top surfaces in the first region A. On the other hand, the second and third conductive patterns 120B and 120C may have portions recessed below the first interlayer dielectric layer 110. The width and the depth of the recessed portion of the third conductive pattern 120C may be greater than the width and the depth of the recessed portion of the second conductive pattern 120B.

The variable resistance pattern 130' may have a single-layered structure or a multi-layered structure including various variable resistance materials. Specially, the variable resistance pattern 130' may include the MTJ structure. When the variable resistance pattern 130' include the MTJ structure, the characteristics of the variable resistance pattern 130' may be secured because the variable resistance pattern 130' is formed over a planarized surface. For example, if a tunnel insulating layer of the MTJ structure is formed over a surface having a poor flatness and bent, the characteristics of the MTJ structure may be deteriorated by a Neel coupling phenomenon, etc. However, this implementation does not cause the deterioration of the characteristics of the MTJ structure by forming the MTJ structure over a planarized surface.

The capping layer pattern 140' may include a non-metallic material which prevents a penetration of a wet chemical. For example, the capping layer pattern 140' may have a single-layered structure or a multi-layered structure including at least one of an amorphous semiconductor material, a silicon nitride, a silicon oxynitride, a metal oxide, or a metal nitride. Due to an existence of the capping layer pattern 140', the fourth conductive pattern 190 may be coupled to the variable resistance pattern 130' by penetrating through the capping layer pattern 140'.

The variable resistance pattern 130' may be switched between different resistance states according to a supplied voltage or current through the first conductive pattern 120A and the fourth conductive pattern 190.

Hereinafter, advantages obtained by the above implementation will be described in comparison with a comparative example of FIG. 7.

Figure 7:
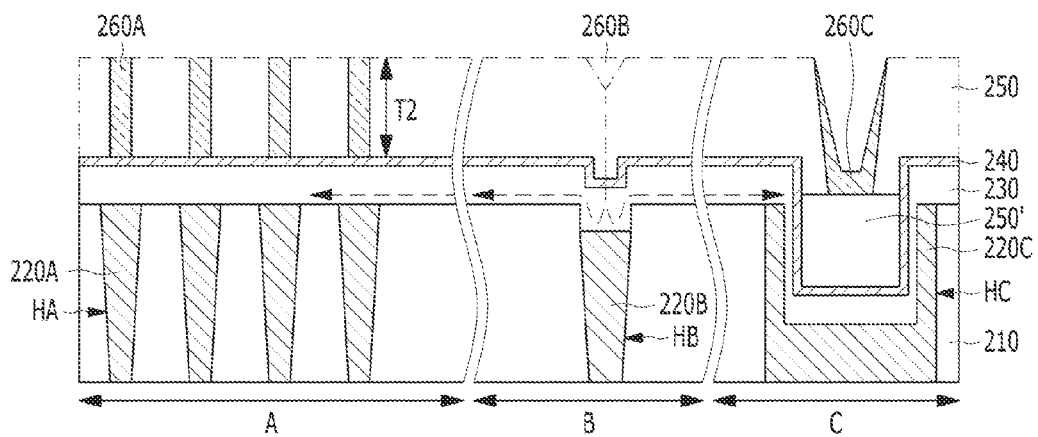
FIG. 7 is a view explaining a semiconductor device and a method for fabricating the same in accordance with a comparative example.

FIG. 7 is a view explaining a semiconductor device and a method for fabricating the same in accordance with a comparative example. The semiconductor device shown in FIG. 7 correspond to the semiconductor device of FIGS. 3 and 4.

Referring to FIG. 7, in the comparative example, a capping layer 240 may be formed of or include a metallic material. In this case, a wet chemical passes through the capping layer 240 during the removal of a mold layer 250. Here, a variable resistance layer 230 of a second region B may have a seam and/or a crack due to height differences of an underlying structure, so the wet chemical may penetrate to a lowermost portion of the variable resistance layer 230. When there is a weak layer which is weak in the wet chemical in the variable resistance layer 230, such as a seed layer located at a lowermost portion of the MTJ structure, the wet chemical moves along the weak layer to attack the weak layer. A dotted arrow shows a moving path of the wet chemical. Due to this, the weak layer may collapse in a first region A adjacent to the second region B, so it is difficult to form a variable resistance pattern having a targeted shape. Thus, the variable resistance pattern such as the MTJ structure may be tilted or completely collapse.

Also, referring to FIG. 7, when the capping layer 240 is formed of a metallic material which is generally soft compared to a ceramic material, a thickness T2 of the mold layer 250 or a hard mask pattern 260A of the comparative example should be greater than a thickness T1 of the mold layer 150 or the hard mask pattern 160A of the implementation of the disclosed technology. In this case, a removal process time of the mold layer 250 of the first region A may be increased, so the remaining mold layer 250' of a third region C may be more reduced as compared to the remaining mold layer 150' of the implementation. Due to this, a second hard mask material 260C of the third region C may not adhere to the remaining mold layer 250' and may take off from the remaining mold layer 250'. The second hard mask material 260C which takes off from the remaining mold layer 250' may cause a defect of a semiconductor device.

However, by this implementation, a non-metallic material blocking a wet chemical may be used as the capping layer 140. Therefore, all the problems of the comparative example may be solved. That is, although multiple regions have different height from each other, it is possible to prevent the wet chemical from penetrating into the variable resistance layer 130 during the removal of the mold layer 150. As a result, a collapse of the variable resistance pattern 130' may be prevented. Furthermore, a contact area between the second hard mask material 160C and the remaining mold layer 150' may be increased by reducing heights of the mold layer 150 and the hard mask pattern 160'. As a result, it is possible to prevent the second hard mask material 160C from being detected as a defect.

The above and other memory circuits or semiconductor devices based on the disclosed technology can be used in a range of devices or systems. FIGS. 8-12 provide some examples of devices or systems that can implement the memory circuits disclosed herein.

Figure 8:
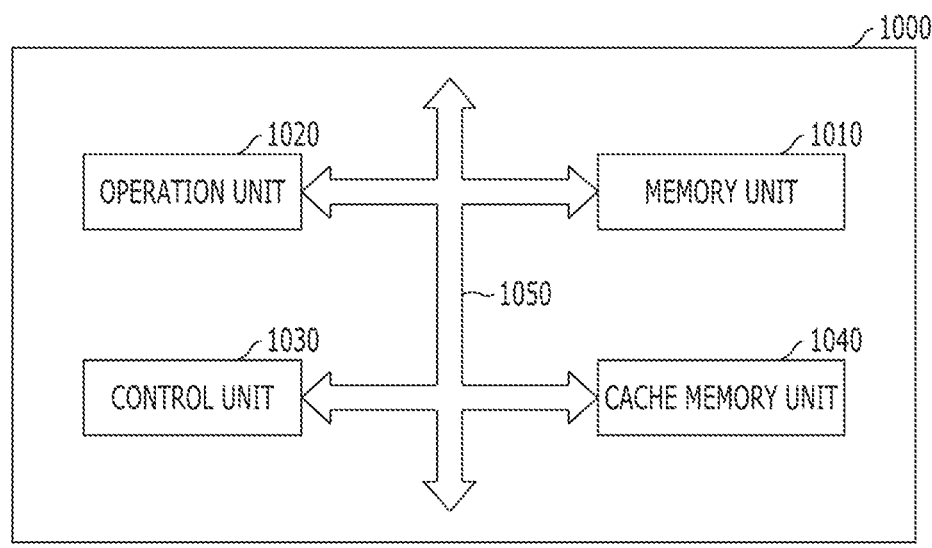
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate including a first region where a variable resistance pattern is disposed and a second region where another element is disposed; an interlayer dielectric layer formed over the substrate and having a first conductive pattern and a second conductive pattern, wherein the first conductive pattern is located at the first region and has a planarized top surface with the interlayer dielectric layer, and the second conductive pattern is located at the second region and has at least a portion recessed below a top surface of the interlayer dielectric layer; the variable resistance pattern formed over the interlayer dielectric layer and having a bottom surface coupled to the first conductive pattern; and a capping layer pattern formed over the variable resistance pattern and having a sidewall aligned with the variable resistance pattern while including a non-metallic material which prevents a penetration of a wet chemical. Through this, a reliability of the memory unit 1010 may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
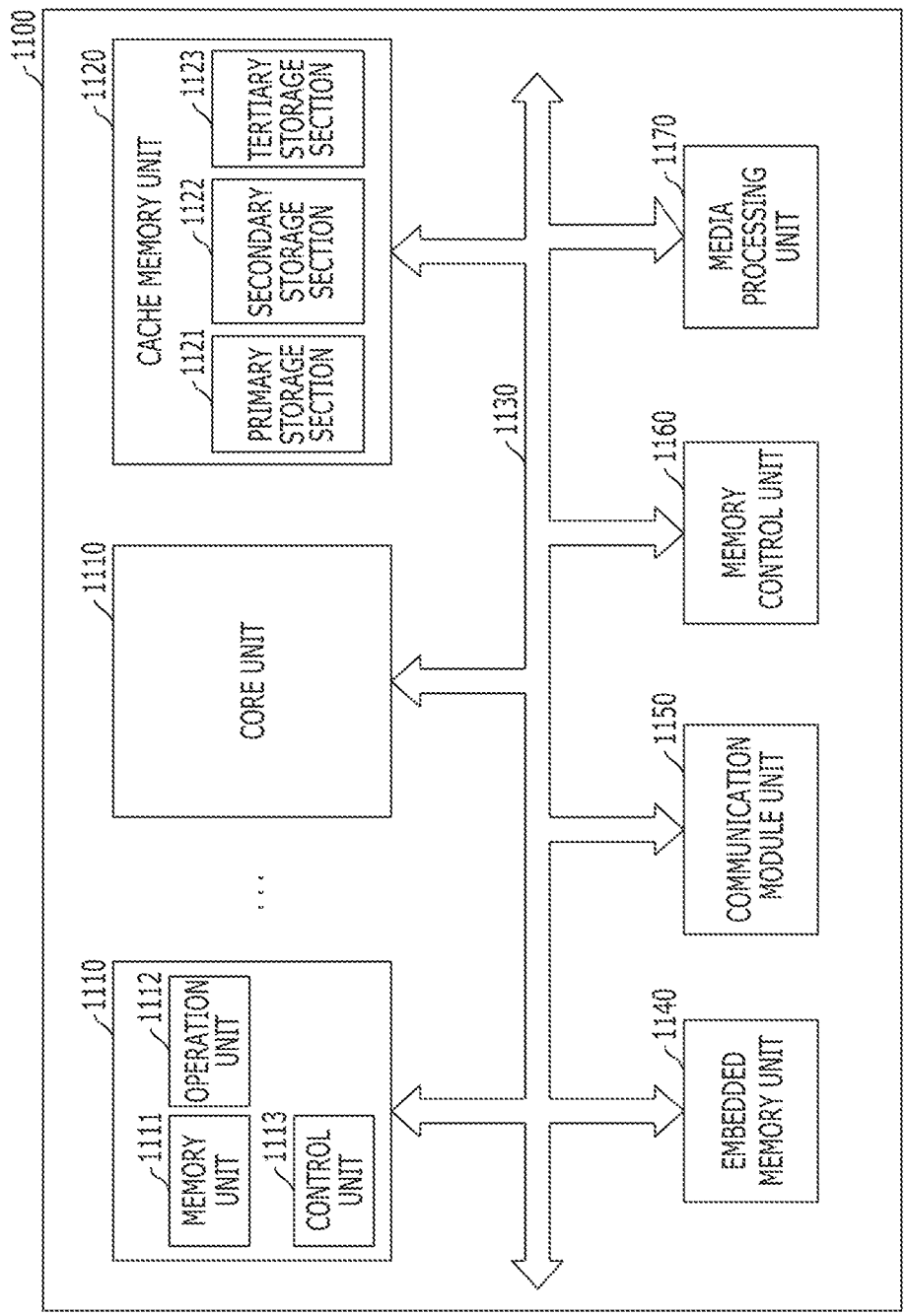
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate including a first region where a variable resistance pattern is disposed and a second region where another element is disposed; an interlayer dielectric layer formed over the substrate and having a first conductive pattern and a second conductive pattern, wherein the first conductive pattern is located at the first region and has a planarized top surface with the interlayer dielectric layer, and the second conductive pattern is located at the second region and has at least a portion recessed below a top surface of the interlayer dielectric layer; the variable resistance pattern formed over the interlayer dielectric layer and having a bottom surface coupled to the first conductive pattern; and a capping layer pattern formed over the variable resistance pattern and having a sidewall aligned with the variable resistance pattern while including a non-metallic material which prevents a penetration of a wet chemical. Through this, a reliability of the cache memory unit 1120 may be improved. As a consequence, it is possible to improve operating characteristics of the processor 1100.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
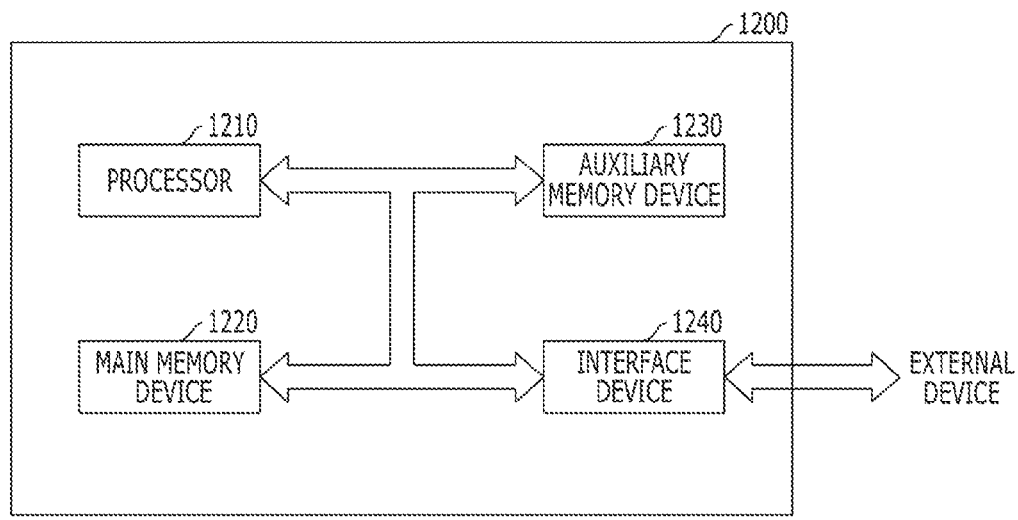
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate including a first region where a variable resistance pattern is disposed and a second region where another element is disposed; an interlayer dielectric layer formed over the substrate and having a first conductive pattern and a second conductive pattern, wherein the first conductive pattern is located at the first region and has a planarized top surface with the interlayer dielectric layer, and the second conductive pattern is located at the second region and has at least a portion recessed below a top surface of the interlayer dielectric layer; the variable resistance pattern formed over the interlayer dielectric layer and having a bottom surface coupled to the first conductive pattern; and a capping layer pattern formed over the variable resistance pattern and having a sidewall aligned with the variable resistance pattern while including a non-metallic material which prevents a penetration of a wet chemical. Through this, a reliability of the main memory device 1220 may be improved. As a consequence, it is possible to improve operating characteristics of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate including a first region where a variable resistance pattern is disposed and a second region where another element is disposed; an interlayer dielectric layer formed over the substrate and having a first conductive pattern and a second conductive pattern, wherein the first conductive pattern is located at the first region and has a planarized top surface with the interlayer dielectric layer, and the second conductive pattern is located at the second region and has at least a portion recessed below a top surface of the interlayer dielectric layer; the variable resistance pattern formed over the interlayer dielectric layer and having a bottom surface coupled to the first conductive pattern; and a capping layer pattern formed over the variable resistance pattern and having a sidewall aligned with the variable resistance pattern while including a non-metallic material which prevents a penetration of a wet chemical. Through this, a reliability of the auxiliary memory device 1230 may be improved. As a consequence, it is possible to improve operating characteristics of the system 1200.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
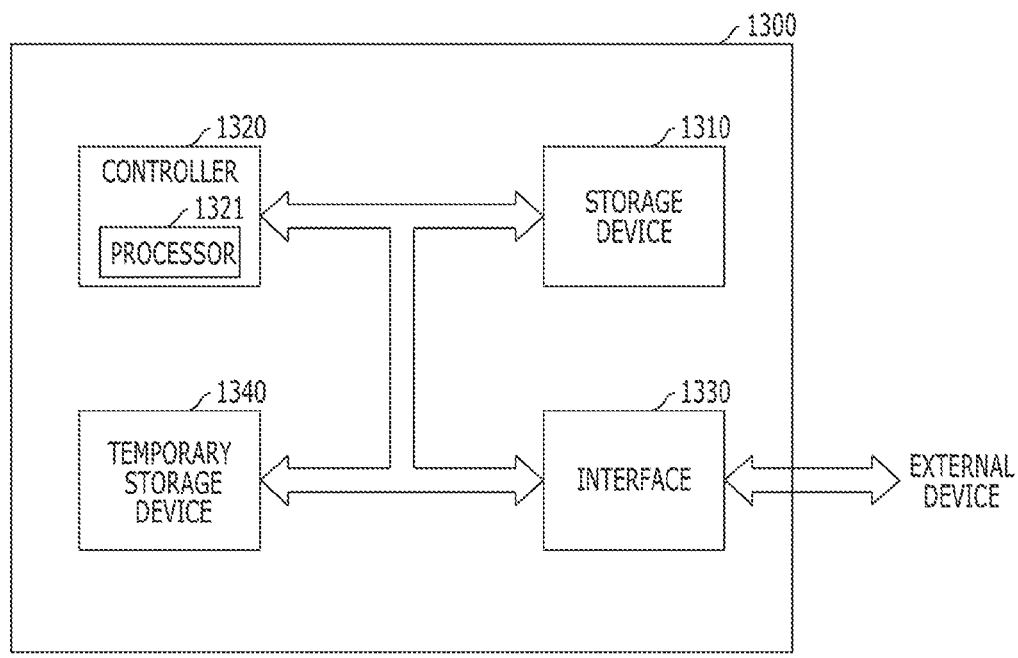
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate including a first region where a variable resistance pattern is disposed and a second region where another element is disposed; an interlayer dielectric layer formed over the substrate and having a first conductive pattern and a second conductive pattern, wherein the first conductive pattern is located at the first region and has a planarized top surface with the interlayer dielectric layer, and the second conductive pattern is located at the second region and has at least a portion recessed below a top surface of the interlayer dielectric layer; the variable resistance pattern formed over the interlayer dielectric layer and having a bottom surface coupled to the first conductive pattern; and a capping layer pattern formed over the variable resistance pattern and having a sidewall aligned with the variable resistance pattern while including a non-metallic material which prevents a penetration of a wet chemical. Through this, a reliability of the storage device 1310 or the temporary storage device 1340 may be improved. As a consequence, it is possible to improve operating characteristics and data storage characteristics of the data storage system 1300.

Figure 12:
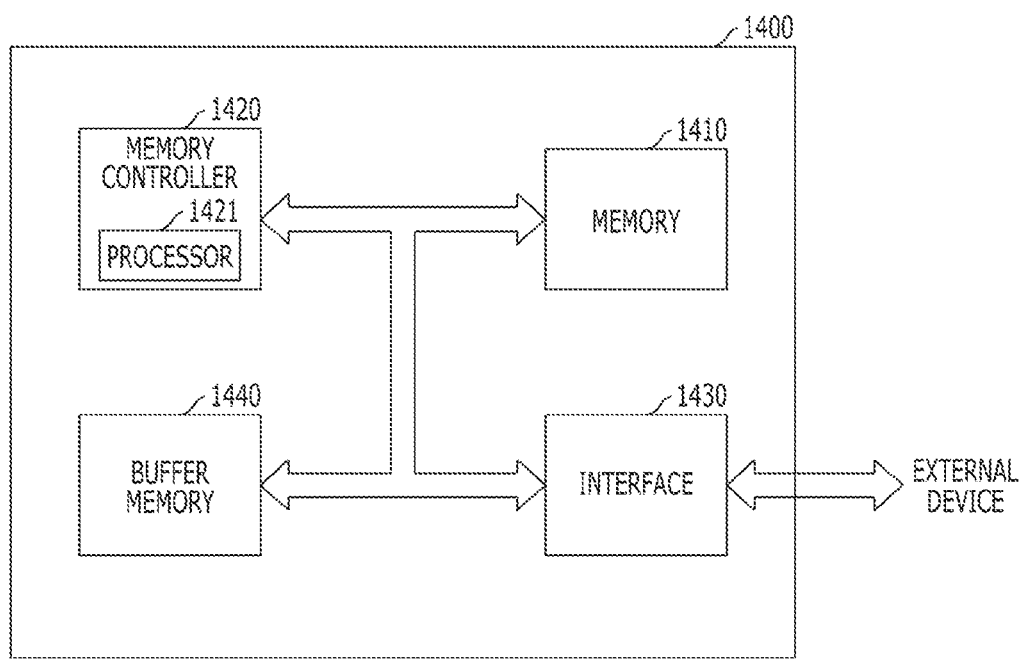
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate including a first region where a variable resistance pattern is disposed and a second region where another element is disposed; an interlayer dielectric layer formed over the substrate and having a first conductive pattern and a second conductive pattern, wherein the first conductive pattern is located at the first region and has a planarized top surface with the interlayer dielectric layer, and the second conductive pattern is located at the second region and has at least a portion recessed below a top surface of the interlayer dielectric layer; the variable resistance pattern formed over the interlayer dielectric layer and having a bottom surface coupled to the first conductive pattern; and a capping layer pattern formed over the variable resistance pattern and having a sidewall aligned with the variable resistance pattern while including a non-metallic material which prevents a penetration of a wet chemical. Through this, a reliability of the memory 1410 may be improved. As a consequence, it is possible to improve operating characteristics and data storage characteristics of the memory system 1400.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate including a first region where a variable resistance pattern is disposed and a second region where another element is disposed; an interlayer dielectric layer formed over the substrate and having a first conductive pattern and a second conductive pattern, wherein the first conductive pattern is located at the first region and has a planarized top surface with the interlayer dielectric layer, and the second conductive pattern is located at the second region and has at least a portion recessed below a top surface of the interlayer dielectric layer; the variable resistance pattern formed over the interlayer dielectric layer and having a bottom surface coupled to the first conductive pattern; and a capping layer pattern formed over the variable resistance pattern and having a sidewall aligned with the variable resistance pattern while including a non-metallic material which prevents a penetration of a wet chemical. Through this, a reliability of the buffer memory 1440 may be improved. As a consequence, it is possible to improve operating characteristics and data storage characteristics of the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
   a substrate including a first region and a second region different from the first region;
   an interlayer dielectric layer formed over the substrate;
   a first conductive pattern located over the first region and formed in the interlayer dielectric layer, the first conductive pattern including a planarized top surface with a top surface of the interlayer dielectric layer;
   a second conductive pattern located over the second region and formed in the interlayer dielectric layer, the second conductive pattern including at least a portion recessed below the top surface of the interlayer dielectric layer;
   a variable resistance pattern formed over the interlayer dielectric layer the variable resistance pattern having a bottom surface coupled to the first conductive pattern and exhibiting different resistance values; and
   a capping layer pattern formed over the variable resistance pattern and having a sidewall aligned with the variable resistance pattern while including a non-metallic material which prevents a penetration of a wet chemical.

2. The electronic device of claim 1, wherein the capping layer pattern includes an amorphous semiconductor material, a silicon nitride, a silicon oxynitride, a metal oxide or a metal nitride.

3. The electronic device of claim 1, wherein the capping layer pattern includes a double-layered structure in which a metallic layer and a metal oxide layer are stacked or a double-layered structure in which a metallic layer and a metal nitride layer are stacked.

4. The electronic device of claim 1, wherein the first region includes a memory cell array region and the second region includes a peripheral circuit region or a vernier key region.

5. The electronic device of claim 1, wherein the variable resistance pattern includes an MTJ (Magnetic Tunnel Junction) structure.

6. The electronic device of claim 1, wherein the semiconductor memory further includes:
   an additional conductive pattern penetrating through the capping layer pattern to be coupled to a top surface of the variable resistance pattern.

7. The electronic device of claim 1, wherein the substrate further includes a third region,
   the interlayer dielectric layer further has a third conductive pattern located over the third region of the substrate,
   at least a portion of the third conductive pattern is recessed below the top surface of the interlayer dielectric layer, and
   the size of the recessed portion of the third conductive pattern is greater than the size of the recessed portion of the second conductive pattern.

8. The electronic device of claim 1, wherein the first region includes a memory cell array region, the second region includes a peripheral circuit region, and the third region includes a vernier key region.

9. The electronic device according to claim 1, further comprising a processor which includes:
   a core unit configured to perform, based on an input command, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

10. The electronic device according to claim 1, further comprising a data storage system which includes:
    a storage device configured to store data and conserve stored data regardless of power supply;
    a controller configured to control input and output of data to and from the storage device according to an input command;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

11. An electronic device comprising a semiconductor memory, wherein the semiconductor memory includes:
    a substrate including a first region and a second region separate from the first region;
    an interlayer dielectric layer formed over the substrate;
    first conductive patterns located over the first region and formed in the interlayer dielectric layer to provide first conductive paths through the interlayer dielectric layer, each first conductive pattern including a planarized top surface that has the same height with a top surface of the interlayer dielectric layer;

one or more second conductive patterns located over the second region and formed in the interlayer dielectric layer to provide one or more conductive paths through the interlayer dielectric layer, each second conductive pattern including at least a portion recessed below the top surface of the interlayer dielectric layer;

a variable resistance pattern layer formed over the interlayer dielectric layer and including first variable resistance patterns over the first region to form an array of memory cells, each first variable resistance pattern having a bottom surface coupled to one of the first conductive patterns and exhibiting different resistance values for storing data; and a capping layer pattern formed over the variable resistance pattern layer and having a sidewall aligned with the variable resistance pattern layer while including a non-metallic material which prevents a penetration of a wet chemical.

12. The electronic device of claim 11, wherein the capping layer pattern includes an amorphous semiconductor material, a silicon nitride, a silicon oxynitride, a metal oxide or a metal nitride.

13. The electronic device of claim 11, wherein the capping layer pattern includes a double-layered structure in which a metallic layer and a metal oxide layer are stacked or a double-layered structure in which a metallic layer and a metal nitride layer are stacked.

14. The electronic device of claim 11, wherein the second region includes a peripheral circuit region or a vernier key region.

15. The electronic device of claim 11, wherein each of the first variable resistance patterns over the first region to form the array of memory cells includes an MTJ (Magnetic Tunnel Junction) structure.

16. The electronic device of claim 11, wherein the semiconductor memory further includes:

an additional conductive pattern penetrating through the capping layer pattern to be coupled to a top surface of the variable resistance pattern layer.

17. The electronic device of claim 11, wherein the substrate further includes a third region, the interlayer dielectric layer further has a third conductive pattern located over the third region of the substrate, a portion of the third conductive pattern is recessed below the top surface of the interlayer dielectric layer, and the size of the recessed portion of the third conductive pattern is greater than the size of the recessed portion of the second conductive pattern.

18. The electronic device of claim 17, wherein the second region includes a peripheral circuit region, and the third region includes a vernier key region.

* * * * *